United States Patent
Friedland et al.

(10) Patent No.: US 10,496,234 B2
(45) Date of Patent: Dec. 3, 2019

(54) MODELING THE CONNECTION BETWEEN THE SOFTWARE SIGNAL PATH AND HARDWARE SIGNAL PATH USING ROUTES

(71) Applicant: The Boeing Company, Chicago, IL (US)

(72) Inventors: Brittany A. Friedland, Seattle, WA (US); Robert L. Malone, Mukilteo, WA (US); John R. Herrold, Goodyear, AZ (US); Gregory P. Green, Kent, WA (US)

(73) Assignee: THE BOEING COMPANY, Chicago, IL (US)

( * ) Notice: Subject to any disclaimer, the term of this patent is extended or adjusted under 35 U.S.C. 154(b) by 276 days.

(21) Appl. No.: 15/048,152

(22) Filed: Feb. 19, 2016

(65) Prior Publication Data

US 2017/0242551 A1 Aug. 24, 2017

(51) Int. Cl.
| | | |
|---|---|---|
| *G06F 3/048* | (2013.01) | |
| *G06F 3/0481* | (2013.01) | |
| *G06F 17/22* | (2006.01) | |
| *G06F 17/50* | (2006.01) | |
| *H04L 12/24* | (2006.01) | |
| *H04L 29/08* | (2006.01) | |
| *G06F 8/34* | (2018.01) | |
| *G06F 9/445* | (2018.01) | |

(Continued)

(52) U.S. Cl.
CPC ............ *G06F 3/0481* (2013.01); *G06F 8/34* (2013.01); *G06F 9/44505* (2013.01); *G06F 17/2247* (2013.01); *G06F 17/5095* (2013.01); *G08G 5/0021* (2013.01); *H04B 7/18506* (2013.01); *H04L 41/12* (2013.01); *H04L 41/22* (2013.01); *H04L 67/12* (2013.01)

(58) Field of Classification Search
CPC ............... G06F 3/0481; G06F 17/2247; G06F 17/5095; H04L 41/22; H04L 67/12
USPC ........................................................ 715/745
See application file for complete search history.

(56) References Cited

U.S. PATENT DOCUMENTS

| | | | | |
|---|---|---|---|---|
| 7,436,297 B1 * | 10/2008 | Tucker | ................... | G08B 25/04 340/508 |
| 8,289,688 B2 * | 10/2012 | Behar | ..................... | G06F 1/162 361/679.3 |

(Continued)

OTHER PUBLICATIONS

Extended European Search Report dated Jul. 17, 2025 for European Application No. 171560870.3.

(Continued)

*Primary Examiner* — David Phantana-angkool
(74) *Attorney, Agent, or Firm* — Gates & Cooper LLP

(57) ABSTRACT

An improved system and method for modeling the data paths amongst the multiple avionic components inside an aircraft is described. A graphical user interface (GUI) operable to depict an interactive environment representing avionic components and data paths between the avionic components is generated, where the graphical user interface depicts a representation of an input, output, and operation associated with the avionic components. Using the GUI, data indicative of the input, output, and operation is received. The data is stored in a machine readable form, and translated into binary form usable to control on-aircraft communication between the avionic components.

37 Claims, 10 Drawing Sheets

(51) Int. Cl.
*G08G 5/00* (2006.01)
*H04B 7/185* (2006.01)

(56) References Cited

U.S. PATENT DOCUMENTS

| | | | | |
|---|---|---|---|---|
| 8,788,125 B1* | 7/2014 | Lahr | ................... | G01C 23/005 |
| | | | | 701/14 |
| 8,928,497 B2* | 1/2015 | Camus | ............... | G05B 23/0227 |
| | | | | 307/10.1 |
| 9,834,317 B2* | 12/2017 | Besseau | ................. | B64D 45/00 |
| 9,977,575 B2* | 5/2018 | Smuga | ................. | G06F 3/0482 |
| 10,222,935 B2* | 3/2019 | Vedha | ............... | G06F 16/24578 |
| 10,321,310 B1* | 6/2019 | Scheer | ................. | H04W 12/06 |
| 2007/0055976 A1 | 3/2007 | Ward et al. | | |
| 2007/0115938 A1* | 5/2007 | Conzachi | ............... | G07C 5/008 |
| | | | | 370/352 |
| 2008/0215927 A1* | 9/2008 | Roussel | ............. | G06F 11/0715 |
| | | | | 714/47.1 |
| 2010/0176972 A1* | 7/2010 | Camus | ............... | G05B 23/0227 |
| | | | | 340/945 |
| 2011/0160936 A1* | 6/2011 | Campagne | ........... | G05B 23/027 |
| | | | | 701/3 |
| 2013/0138269 A1* | 5/2013 | Pangilinan | ........... | G08G 5/0021 |
| | | | | 701/3 |
| 2013/0179842 A1* | 7/2013 | Deleris | ................. | G06F 3/0484 |
| | | | | 715/853 |
| 2015/0363213 A1 | 12/2015 | Heinlein et al. | | |
| 2017/0186328 A1* | 6/2017 | Beernaert | ................. | B64F 5/60 |
| 2017/0242551 A1* | 8/2017 | Friedland | ........... | H04B 7/18506 |

OTHER PUBLICATIONS

Vestal, S., "MetaH Support for Real-Time Multi-Processor Avionics", in Proc. IEEE Workshop on Parallel and Distributed Real-Time Systems, pp. 11-21, Apr. 1-3, 1997, Geneva, Switzerland (& IEEE Comput. Soc., Apr. 1, 1997, Los Alamitos, CA).

European Examination Report dated Sep. 24, 2019 for European Patent Application No. 17156087.3.

* cited by examiner

MODELING THE CONNECTION BETWEEN THE SOFTWARE SIGNAL PATH AND HARDWARE SIGNAL PATH USING ROUTES

TECHNICAL FIELD

The present invention relates generally to systems engineering for aircraft and other vehicles for transportation, and more particularly to a system for generating a graphical user interface representing avionic components and data paths between the avionic components.

BACKGROUND

Aircraft avionic components have historically been described by specifications and interface control documents (ICDs). However, identification and verification of end-to-end communication between avionic components requires time-consuming review of individual component specifications and ICDs. Thus, there exists a need for a graphical user interface depicting the end-to-end communication between avionic components using data paths.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

One way to reduce the time and effort required to document communication between avionic components, for instance, is to identify and verify end-to-end communications and generate an integrated protocol dependent Interface Control Document/Drawing (ICD) model with data path (route) elements. Data path elements typically provide the modeling necessary to define logical associations from one transmitter with one or more receivers (e.g., virtual links) to another in an Ethernet communication network.

A system configured to generate a graphical user interface (GUI) that depicts an interactive environment representing avionic components and data paths between the avionic components, receiving data indicative of the representation of the input, output, and operation associated with the avionic components, storing the data in a machine readable format, and translating the data to control the avionic components is disclosed herein. By generating a GUI that represents the data paths between the avionic components, the processing and reviewing time to document the communication between the components may be decreased. When using the GUI to represent the data paths amongst the various avionic components, the representation generated by the GUI may also be stored in a machine readable format. This representation, in machine readable format, may be stored in an aircraft system and further translated into binary form to control the communication between the various avionic components. This way, the time it takes to dissect and verify the data paths amongst the thousands, if not hundreds of thousands of data connections for avionic components that are assembled inside an aircraft, may be conveniently represented by this generated GUI (model). A user may also interact with the GUI to efficiently review, document, or re-route the data paths.

In illustrative examples of the present disclosure, a system, method, and computer-readable medium are provided for generating a GUI representing avionic components and data paths between the avionic components. According to one particular implementation, a system includes one or more memories having stored thereon computer-readable instructions that, upon execution by a computing device, cause the system to: generate a GUI operable to depict an interactive environment representing avionic components and data paths between the avionic components, where the GUI depicts a representation of an input, output, and operation associated with the avionic components, receive, via the graphical user interface, data indicative of the input, output, and operation, store the data in a machine readable form, and translate the data into binary form usable to control on-aircraft communication between the avionic components.

According to another particular implementation, a method for generating a GUI operable to depict an interactive environment representing avionic components and data paths between the avionic components, where the graphical user interface depicts a representation of an input, output, and operation associated with the avionic components, receiving, via the GUI, data indicative of the input, output, and operation, storing the data in a machine readable form, and translating the data into binary form usable to control on-aircraft communication between the avionic components.

According to yet another particular implementation, a computer-readable medium representing end-to-end communication between avionic components, bearing computer-executable instructions that, when executed upon a computer, cause the computer to perform operations comprising: generating a GUI operable to depict an interactive environment representing avionic components and data paths between the avionic components, where the GUI depicts a representation of an input, output, and operation associated with the avionic components, receiving, via the graphical user interface, data indicative of the input, output, and operation, storing the data in a machine readable form, and translating the data into binary form usable to control on-aircraft communication between the avionic components.

BRIEF DESCRIPTION OF DRAWINGS

The foregoing Summary and the following Detailed Description are better understood when read in conjunction with the appended drawings. In order to illustrate the present disclosure, various aspects of the disclosure are shown. However, the disclosure is not limited to the specific aspects discussed. The following figures are included.

DETAILED DESCRIPTION OF ILLUSTRATIVE EMBODIMENTS

Figure 1A:
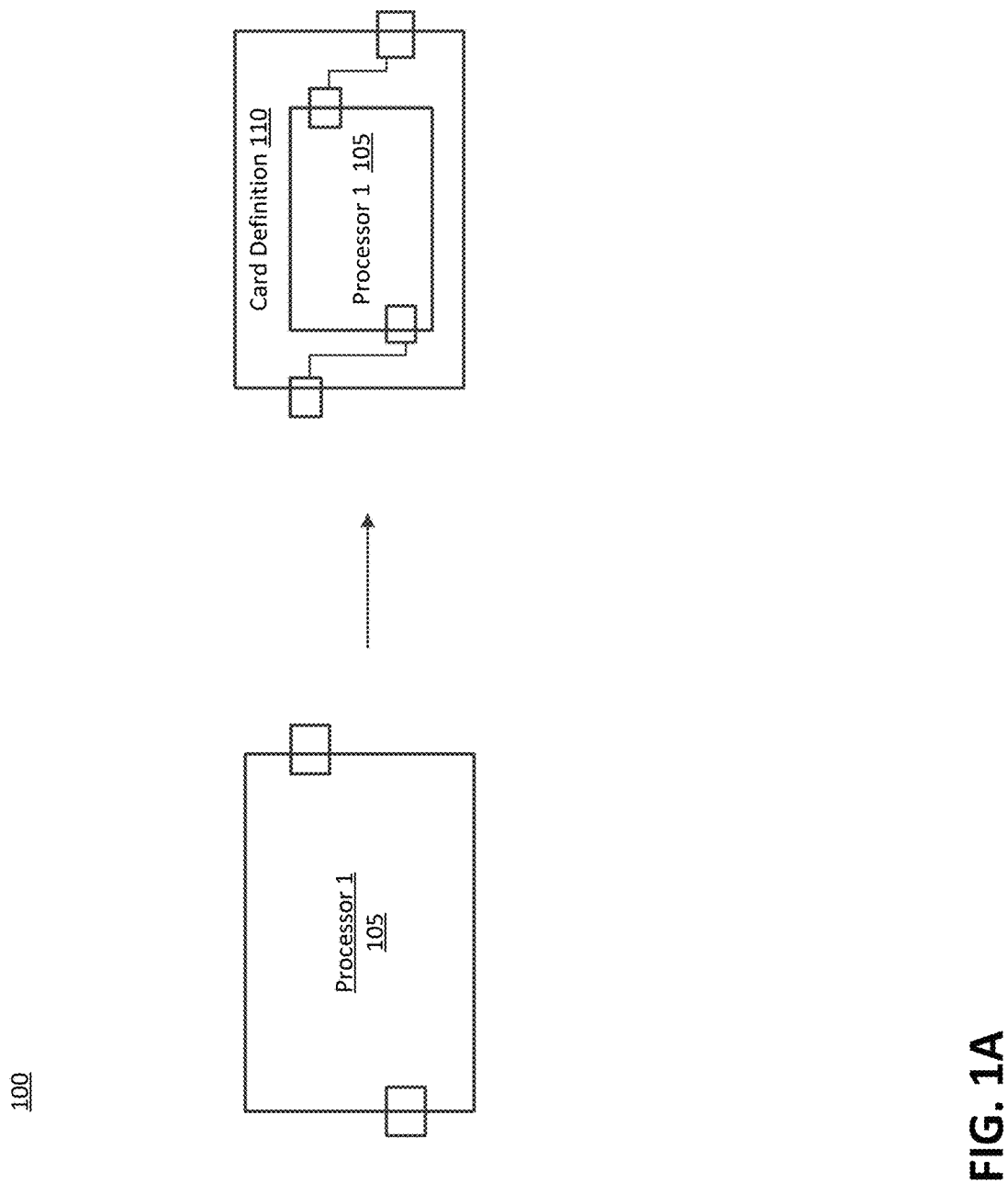
FIG. 1A is a block diagram depicting one stage of a model assembly buildup.

In airplane design and development where multiple avionic or electronic components are intertwined and interconnected with one another, there exists an increased demand for improvements in modeling and implementing a representation of a communication network documenting the multiple components. Thus, a system configured to generate a graphical user interface (GUI) representing the network of avionic components or a model that visually represents the end-to-end Interface Control Document/Drawing (ICD) of the multiple avionic components in an aircraft system may be advantageous.

The generated GUI, representing the communication between the avionic components, uses Systems Modeling Language (SysML). The representation of the communication of the avionic components may also be stored in a machine readable format (e.g., Extensible Markup Language (XML)). Once the representation is in XML format, the representation of the data paths between the avionic components may then be translated into binary data. The binary data may then be included in or loaded in (e.g. burned into) a Read-Only-Memory (ROM) and further stored in an aircraft. The binary data may contain information about each of the avionic components and the relationship between the components. The aircraft system may then utilize the binary data to control on-aircraft communications.

Some aircraft systems may contain hundreds, thousands, or even tens of thousands combinations of connections between all the components. Therefore, being able to identify at least one or more avionic or electrical components, generate at least one data (or route) path to connect or represent the connection between two or more avionic components using SysML may decrease the overall time it takes to document and review the end-to-end communication amongst the components. A system that generates a GUI with at least one data path representing the communication or connection between one or more avionic components is disclosed herein. The system may also be configured to translate the initial representation into binary data form. The binary data may also be burned, included, loaded, and/or stored in future aircraft system during manufacturing or assembly processes. The binary data contains the relevant information to control on-aircraft communication amongst the connected avionic components.

Disclosed herein include at least a system, method, and computer-readable medium with a unique and improved mechanism for modeling avionic components and the data paths between the components. Various systems, methods, and computer program products may be employed in conjunction with the practice of various aspects of the present disclosure. Aspects of the present disclosure may be employed in an improved aircraft control system for newly manufactured airplane models or retrofitted into current airplane models. This improved mechanism may comprise generating a GUI that depicts an interactive environment representing avionic components and data paths between the avionic components, receiving data indicative of the representation of the input, output, and operation associated with the avionic components, storing the data in a machine readable format, and translating the data to control the avionic components. Industries, companies, and individuals may all leverage such an approach to improve the digital network control and implementation of any aircraft.

The various examples used in this disclosure are in the context of the design and development of aircraft and avionics systems, but it should be understood that the described principles may be applied to other developmental scenarios involving the modeling of communications between components in a communications network. Such examples in the field of transportation include train, automobile, and ship operations. Additionally, the disclosure may be applicable in other industries.

FIG. 1A illustrates an example of a model assembly buildup without using SysML. The processor 105 (configured with at least two ports) may be placed on a card 110 (also configured with at least two ports). As known to those skilled in the art, the processor 105 may be attached, via various methods, to the card through the ports. In other words, FIG. 1A illustrates a known example embodiment of a processor 105 usage installed on a card 110.

Figure 1B:
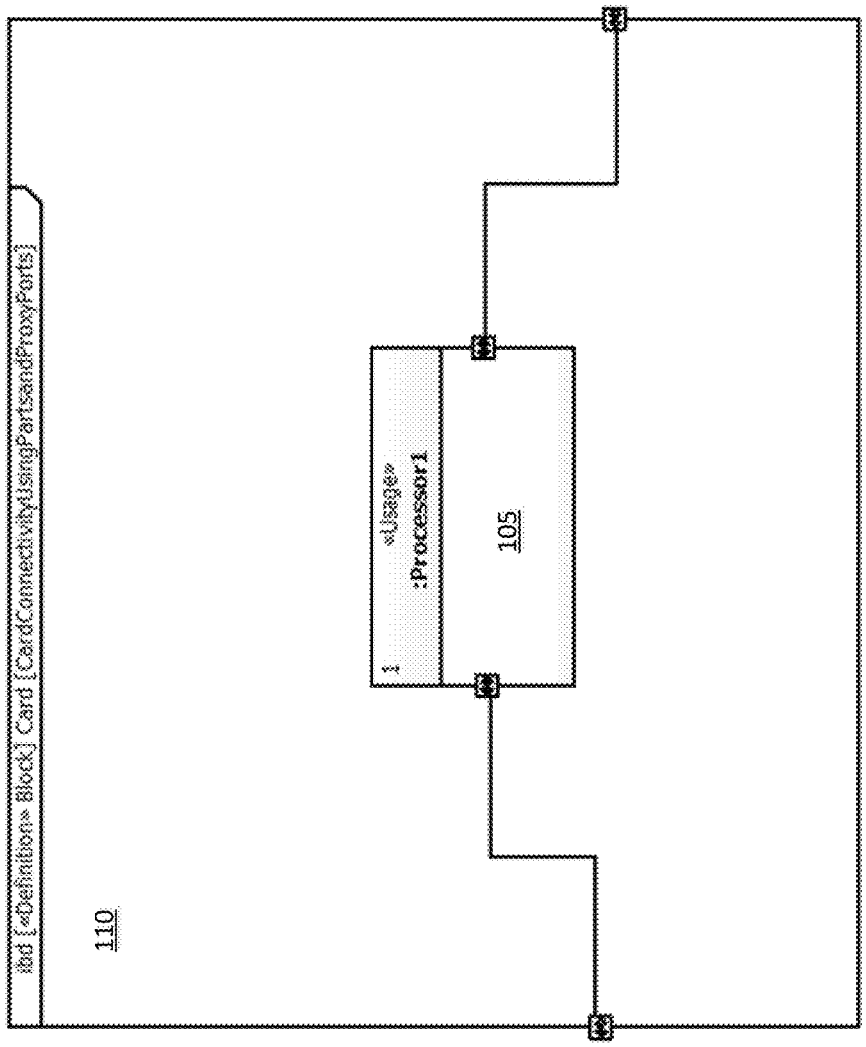
FIG. 1B is a block diagram depicting, via a graphical user interface (GUI), the model assembly buildup of FIG. 1A using Systems Modeling Language (SysML).

FIG. 1B illustrates a generated GUI 150 that depicts an interactive environment of the model assembly buildup of FIG. 1A using SysML. This representation in the generated GUI 150 includes at least the processor 105 and the card 110 from FIG. 1A. The card definition 110 contains usage of a processor 105. The ports on the processor 105 usage may have been redefined to allow for unique connections. As known to those skilled in the art, the representation of FIG. 1B may also be in XML or other known machine readable formats.

Figure 2A:
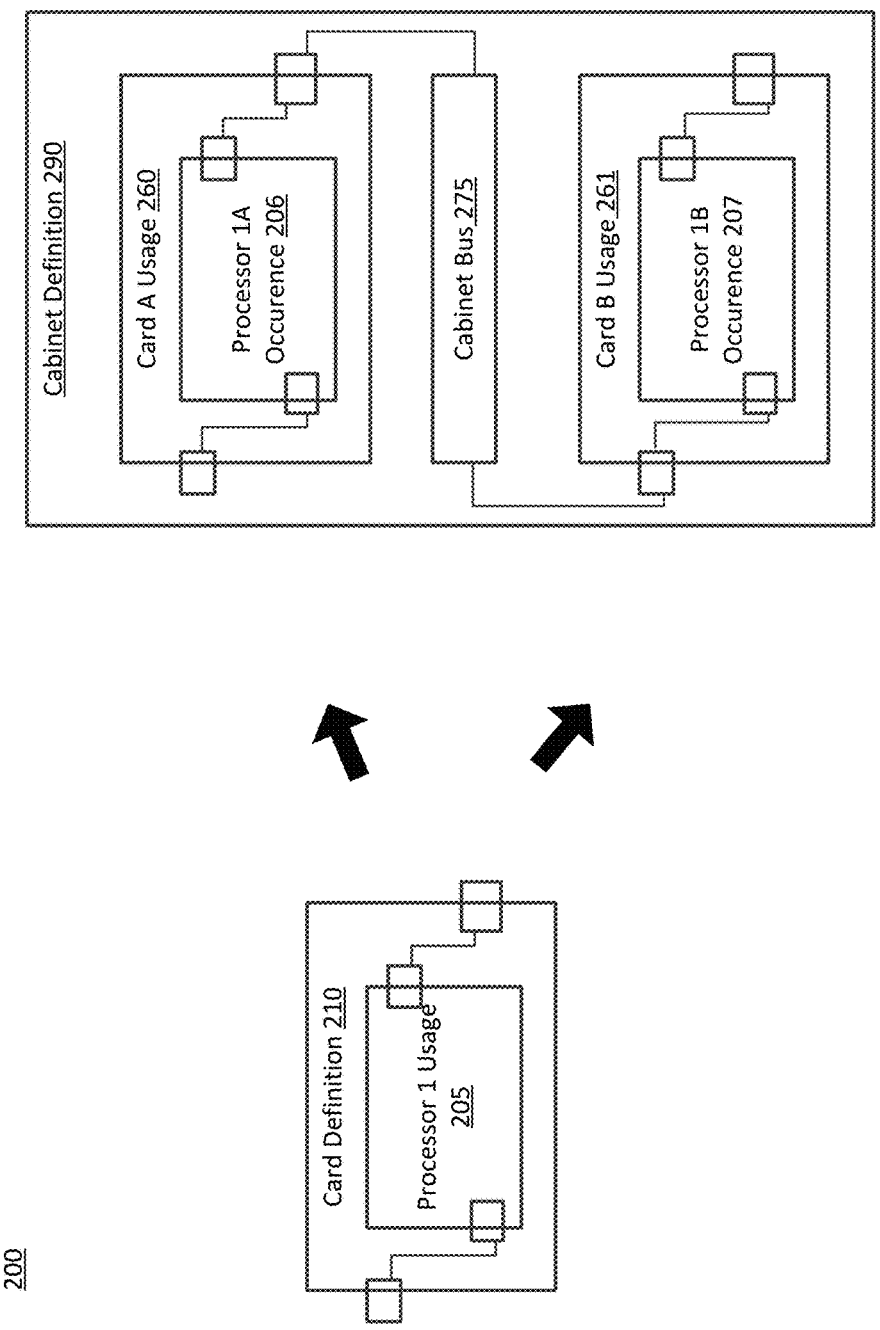
FIG. 2A is a block diagram depicting another stage of the model assembly buildup.

As shown in FIG. 2A, at least two card definitions 210 may be installed on a cabinet 290. Each card usage 260-261 represents a single card definition 210. Similar to the illustration in FIG. 1A, the ports may be configured to connect the card 210 and the processor 205. Each card usage 260-261 may further be uniquely connected to a cabinet bus 275 via the connection ports. Communication between the card usages 260-261 may be obtained via this cabinet bus 275. In essence, FIG. 2A illustrates a known example embodiment of installing two card definitions 210 on a cabinet 290.

Figure 2B:
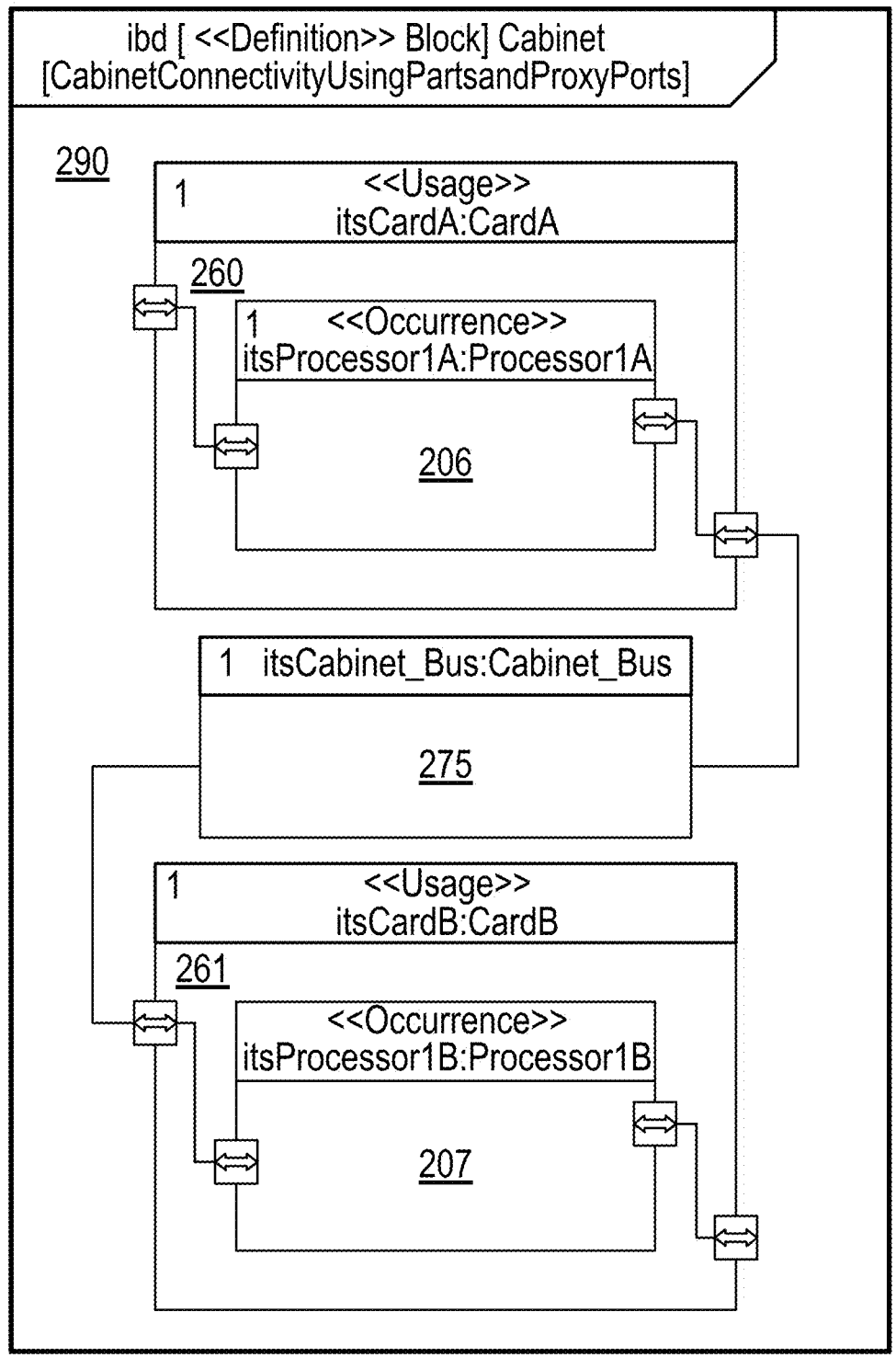
FIG. 2B is a block diagram depicting, via a GUI, the model assembly buildup of FIG. 2A using SysML.

FIG. 2B illustrates a generated GUI 250 that depicts an interactive environment of the model assembly buildup of FIG. 2A using SysML. Similar to description of FIG. 1B, here in FIG. 2B, the generated GUI 250 represents two card usages 260-261 that may be installed on a cabinet definition 290. The two card usages 260-261 may be uniquely interconnected via a cabinet bus 275. The cabinet bus 275, in this instance, may not require ports for connection. As known to those skilled in the art, the representation of FIG. 2B may also be in XML or other known machine readable formats.

Figure 3A:
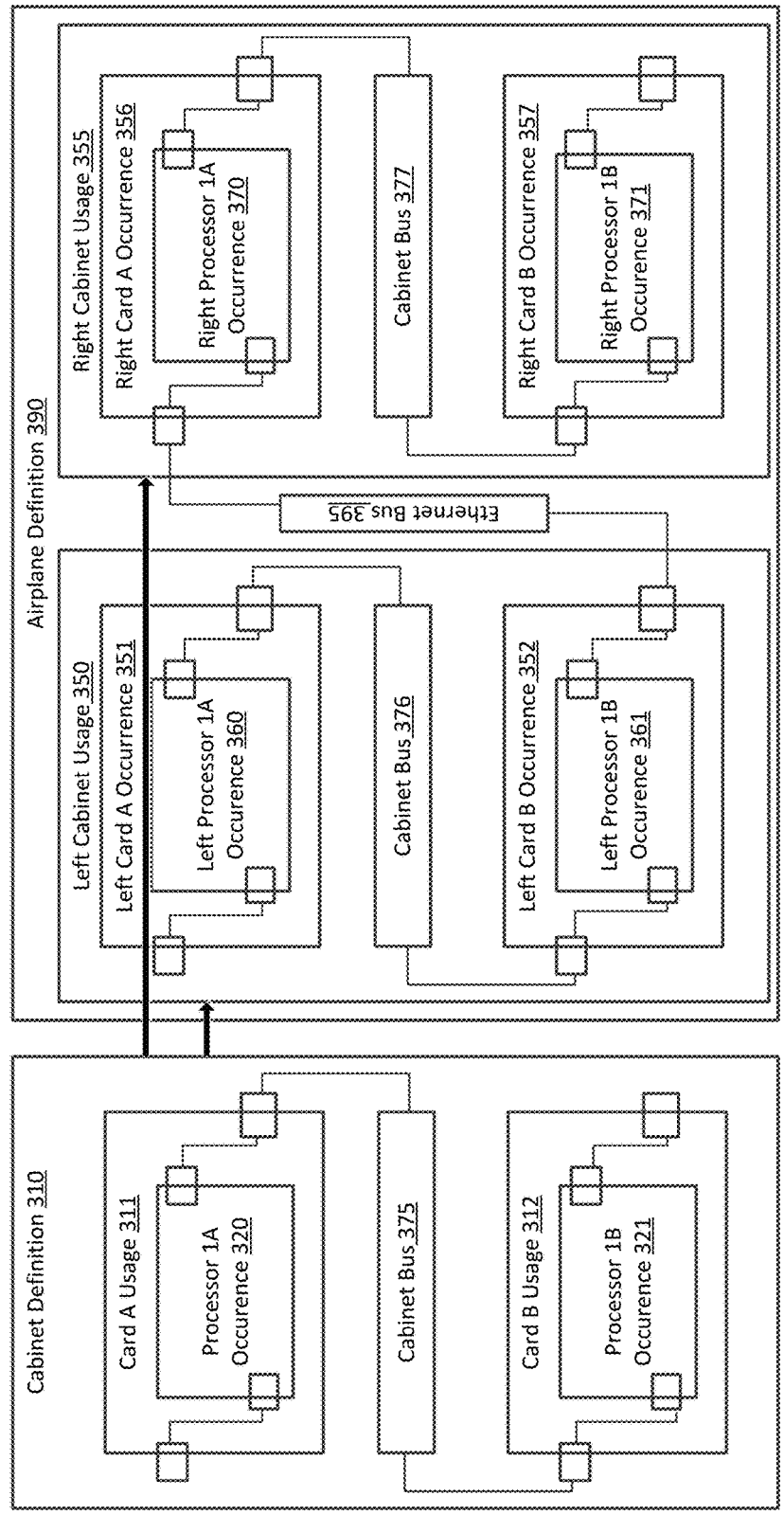
FIG. 3A is a block diagram depicting another stage of the model assembly buildup.

FIG. 3A illustrates applying the cabinet definition 290 described in FIG. 2A to an aircraft (system) definition 390. The aircraft definition 390 may include at least: a left cabinet usage 350 and a right cabinet usage 355. The left cabinet usage 350 may be used to control avionic components located on the left-hand side of the aircraft and the right cabinet usage 355 may be used to control avionic components located on the right-hand side of the aircraft. Similar to the cabinet definition 290 illustrated in FIG. 2A, the left cabinet usage 350 includes at least two card definitions. The left cabinet usage 350 may include at least two card usages connected via a cabinet bus 376. Furthermore, the right cabinet usage 355 mirrors the left cabinet usage 350 but has unique connections. For example, the right cabinet usage 355 also includes two card definitions that are uniquely connected via cabinet bus 377. An Ethernet bus 395 may be used to connect, via the connection ports, the left cabinet usage 350 and the right cabinet usage 355. In essence, FIG. 3A illustrates a known example embodiment of installing two cabinet definitions 310 in an airplane (system) definition 390.

Figure 3B:
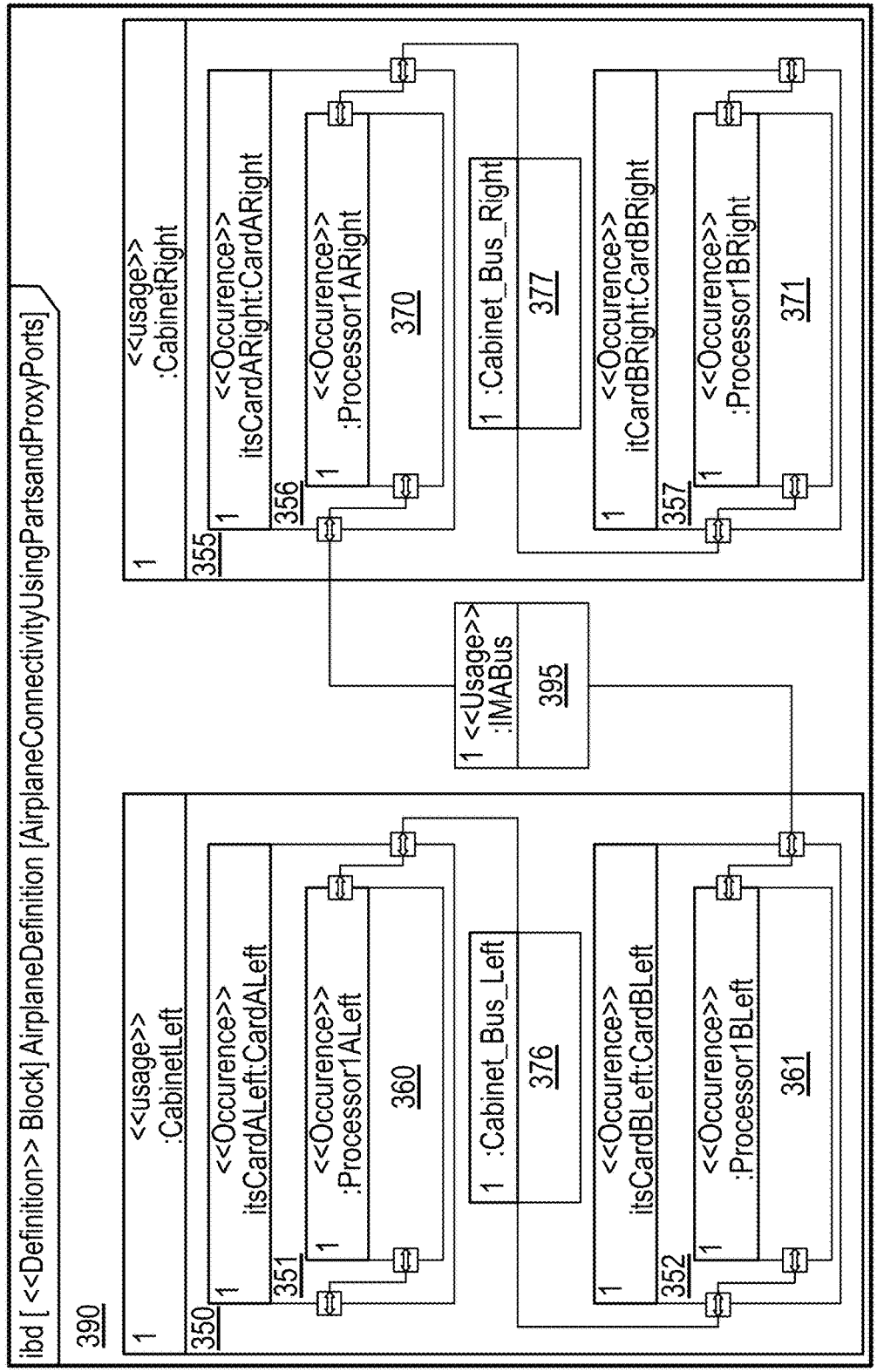
FIG. 3B is a block diagram depicting, via a GUI, the model assembly buildup of FIG. 3A using SysML.

FIG. 3B illustrates a generated GUI 399 that depicts an interactive environment of the model assembly buildup of FIG. 3A using SysML. Each occurrence port pictured may be a unique instance to capture proper connectivity and potential unique attribution. The parts illustrated in FIG. 3B may be interconnected using proxy ports and connectors; whereas, the busses (both cabinet 376-377 and Ethernet 395) may not require ports for connection. As known to those skilled in the art, the representation of FIG. 3B may also be in XML or other known machine readable formats.

Figure 4:
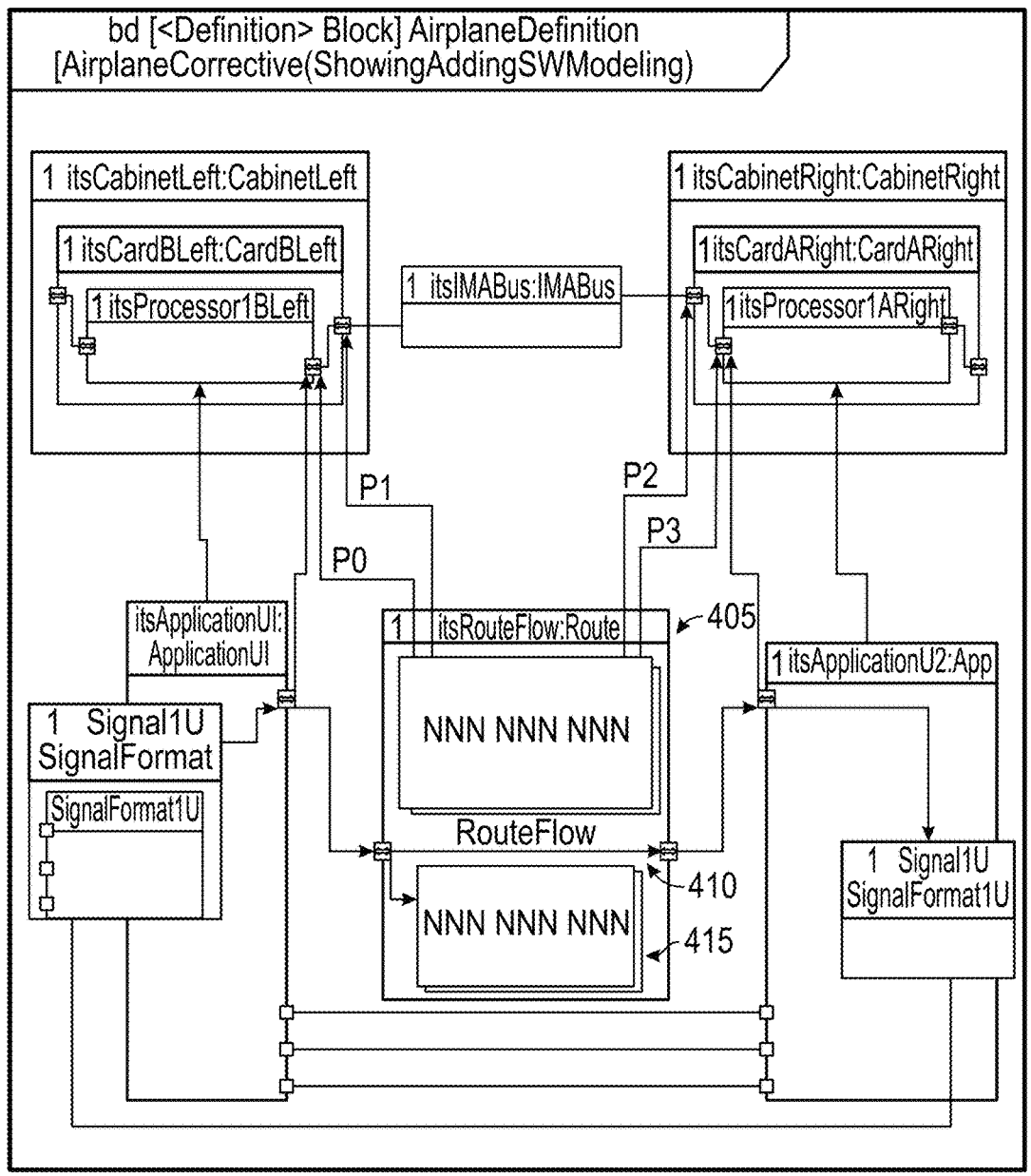
FIG. 4 illustrates the GUI representing route elements (data paths) comprising the combination of the stages from FIGS. 1B, 2B, and 3B.

FIG. 4 illustrates a generated GUI 400 that depicts an interactive environment representing avionic components and data paths between the avionic components of the model assembly buildup from FIGS. 1B, 2B, and 3B using SysML. The generated GUI 400 may include, among other elements, at least any one of: route objects 405, route paths 410, and sub-routes 415. In this generated GUI 400 (using SysML), route objects 405 may define the physical path from one source computer to one or more destination computers. Based on that, the route object 405 may then provide the necessary logical architecture constructs to model the physical path or route paths 410 for signals transmitted from one source computer to one or more destination computers. Moreover, route objects 405 may be comprised of sub-routes 415. Sub-routes 415 may define the order the signal is sent out on these route paths 410. Therefore, FIG. 4 illustrates, in SysML, the airplane definition 390 described in FIG. 3A with additional route objects 405 and route paths 410 representing and defining the order of communication between the avionic components.

By generating the GUI 400 depicting the interactive environment representing avionic components and route paths 410 between the avionic components, it may be advantageous, in an embodiment, to first define the hardware and software interfaces and the signals flowing through the paths. For example, the signals, parameters, and signal formats that are used by the hardware and/or software components to communicate with one another may be first defined. Once the hardware/software interfaces and the signals are defined, the allocation of signals (e.g. signal paths) between software to software ports and/or between software to hardware ports may be configured accordingly. In essence, the data or route paths 410 between the various avionic components whether hardware or software, in an aircraft system, may be represented by this generated GUI 400, in FIG. 4, using SysML.

Typically, in an airplane assembly environment, multiple components such as Line Replaceable Units (LRUs) may be installed that include multiple physical processors. The LRUs are typically interconnected. The connection and communication between such components may be extremely complex and difficult to manage. For instance, when a pilot presses a button inside a cockpit to cause a component to perform some action, the signal generated from the cockpit may be required to pass through multiple networks and components before arriving at the destination component. Hence, this signal, traversing through multiple networks and components, may be difficult to trace. It would be efficient and convenient if the path of the signal was modeled using a system such as SysML in a user-friendly GUI. In other words, the data or route path taken by the signal can be modeled in a software application such that users, authorized personnel, and/or engineers may efficiently and conveniently model and or control the route paths between avionic components.

In an embodiment, once the data or route paths 410 are generated in GUI 400 representing the communication network between the avionic components, the route paths 410 may further be translated to binary format. Once in binary format, the binary form may be included in or loaded in (e.g., burned into) Read-Only-Memory (ROM) located inside an aircraft. The aircraft may then use the binary format to control or configure the Ethernet communication network on the aircraft. Furthermore, the binary format may also be utilized to control or configure the Receiver/Decoder Circuit (RDC) configuration which translates signals to and from the Ethernet communication network to other protocols or analog signals. Aspects of the generated GUI 400 may be employed in the Ethernet network in an improved aircraft control system for newly manufactured airplane models or retrofitted into current airplane models.

Figure 5:
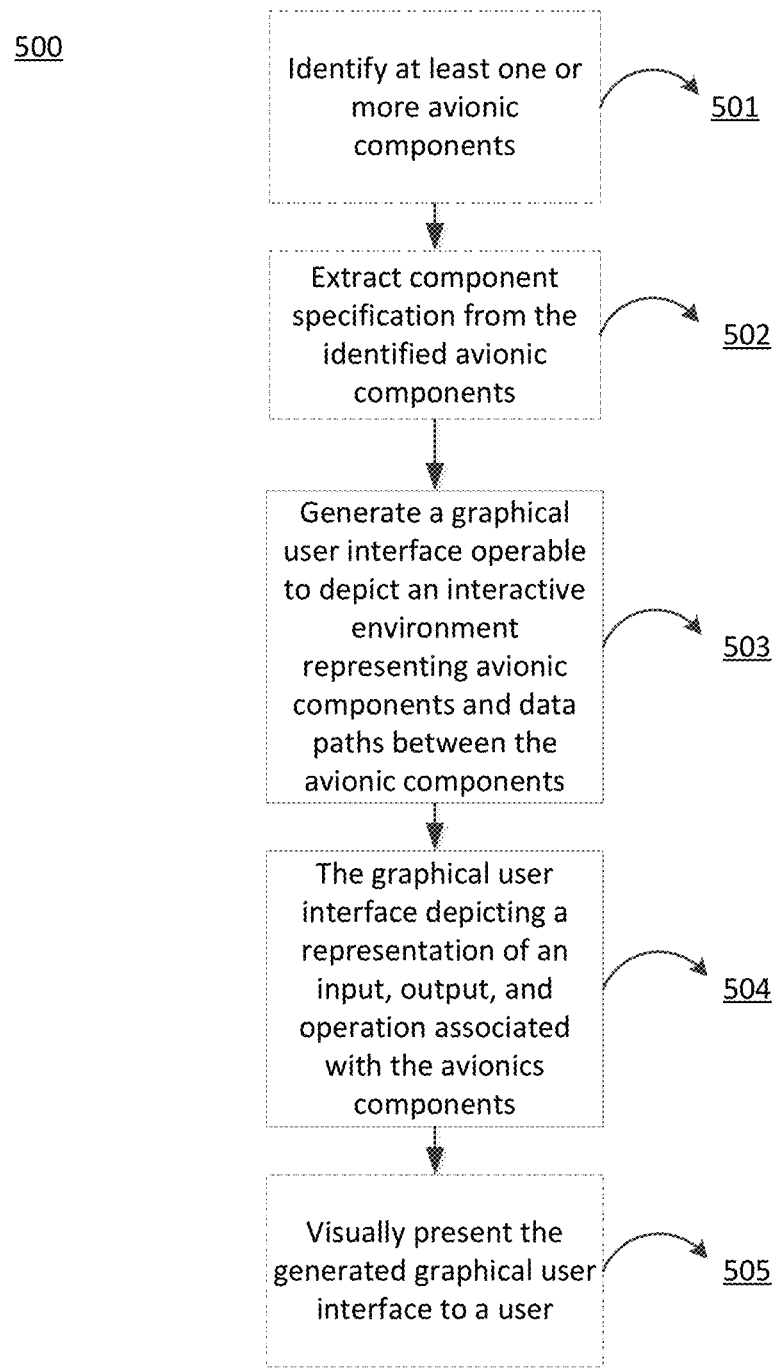
FIG. 5 illustrates a flow diagram representing the generation of a GUI operable to depict an interactive environment representing avionic components and data paths between the avionic components, where the GUI further depicts a representation of an input, output, and operation associated with the avionic components.

FIG. 5 illustrates a flowchart 500 of an example process for generating a GUI depicting an interactive environment representing avionic components and data paths between the avionic components. Referring to block 501, the system may initially identify at least one or more avionic components in an aircraft system. In other words, block 501 discloses that a system may first search, locate, and identify the avionic components prior to generating the GUI representing the interactive communication of an airplane system. As illustrated in dashed lines, block 501 may comprise a step taken by the system but may not be a requirement to the generation of the GUI.

Referring to block 502, the system may further extract a component specification from the identified avionic components. The extracted component specification may include information relevant to the communication between the various avionic components located in an aircraft system. The extracted information may be used to provide the necessary information prior to generating the GUI operable to depict an interactive environment representing avionic components and data paths between the avionic components. The generation of the GUI representation is further described in block 503 below. Block 502 is also illustrated in dashed lines. Similar to block 501, block 502 may be a process be taken by the system but may be optional.

In sum, blocks 501 and 502 may be representative of a system that may perform the identification of the components and further perform the extraction of the specifications from the identified components prior to the system generating a GUI representing interactive environments of the avionic components.

Now referring to block 503, a GUI may be generated depicting an interactive environment. The interactive environment may represent avionic components and data paths between the avionic components. Information to generate this interactive environment may come from blocks 501 and 502 or the information may have been pre-determined from a separate system. The information (component specification) regarding each avionic component and the data paths associated between the avionic components may be provided to the system prior to block 503.

Continuing with block 503, once the GUI is generated, the representation of avionic components and data paths may be in SysML format. Other formats such as XML or Unified Modeling Language (UML) may also be used to represent the avionic components and the data paths between them. The generated GUI representing the avionic components and the data paths between them may further provide traceability between the requirements, functional, logical, and physical architecture between the avionic components. The end-to-end ICD of the multiple avionic components in an aircraft system may be extremely complex; thus, a GUI representing the data paths amongst the avionic components may be more efficient and effective for communication purposes. Representing the avionic environment in SysML, via a GUI, is just one non-limiting example. Other models and representation methods may also be utilized to represent the interactive environment of aircraft components.

Referring to block 504, the representation of the avionic components may include the input, output, and/or operation associated with each individual avionic component. Each individual avionic component may include operational functions and/or instructions. Furthermore, each individual avionic component may also include component specification and/or ICDs. Again, in one example embodiment, this representation of the input, output, and operation associated with each avionic component may be represented in SysML format. As known to those skilled in the art, other known formats may also be used.

Referring to block 505, the GUI may comprise of a visual representation such that a user may adjust, re-route, or amend the data (route) paths accordingly. User input may be received by the system, via the GUI. Based on the user input, certain actions may be taken by the system. As known to those skilled in the art, the user input may be achieved via various methods (e.g., touch input, mouse/keyboard input). In block 505, the visual representation and adjustment process is represented in dashed lines; thus, operation may be optional.

Figure 6:
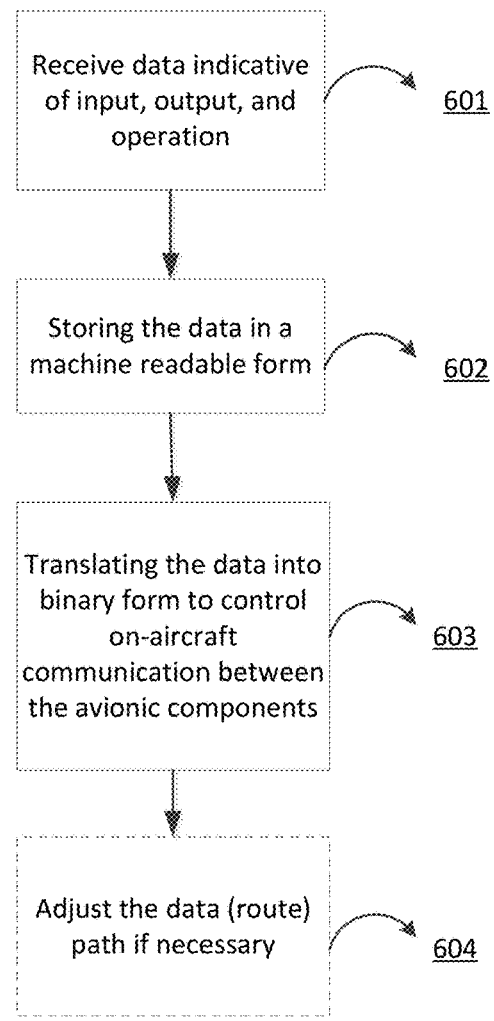
FIG. 6 illustrates a flow diagram representing receiving data indicative of the input, output, and operation, storing the data in a machine readable form, and translating the data into binary form usable to control on-aircraft communication between the avionic components.

FIG. 6 illustrates a flowchart 600 of the steps and process a system may perform when receiving data indicating the representation of the avionic components. Referring to block 601, the system may initially receive data, via the GUI, that are indicative of input, output, and/or operational functions associated with each avionic component. The data may be in SysML format and include information that pertains to the inter-connection or relationship between the avionic components located inside an aircraft.

Referring to block 602, the system may store the received data in a machine readable format. The machine readable form may comprise an XML format, instead of the SysML format as prescribed in block 601 above. The storage of data may be located in a storage medium inside or outside of an airplane. In an embodiment, the data may be stored inside the aircraft so that the data may be conveniently accessible and further utilized to control the on-board communication between the avionic components.

Referring to block 603, the data received, via the GUI, may be translated. The process of translating the data into binary form may be accomplished either automatically or dynamically. Once translated into binary form, the data may then be used to control on-aircraft communication between the avionic components. In some embodiments, the system may also include at least one controller configured to use the data and control the on-aircraft communication.

In block 604, the data may be adjusted, as necessary, by way of user input via the GUI. Block 604 is illustrated in dashed lines; thus, block 604 may be an additional step taken by the system. As known to those skilled in the art, there may be other known methods of adjusting or re-routing data paths in an aircraft environment.

Figure 7:
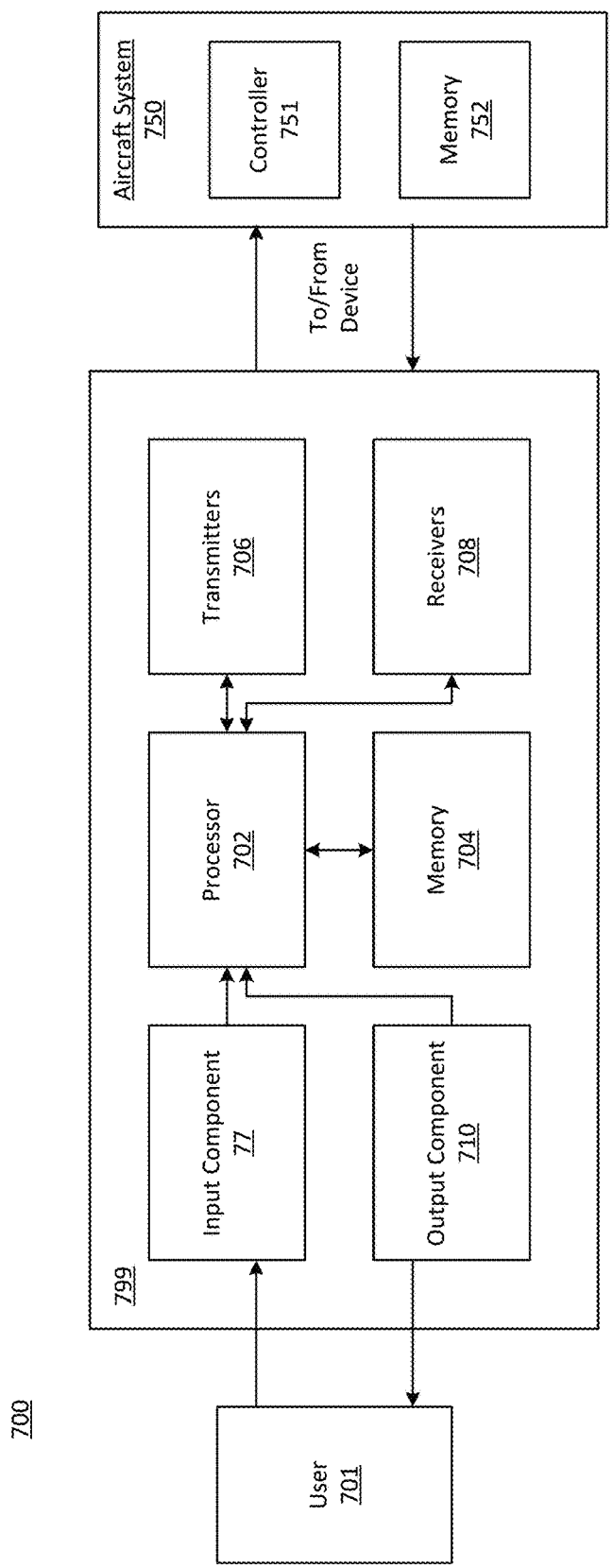
FIG. 7 illustrates an example schematic diagram of a computing device system with a computing device connected to a separate aircraft system or computing device for end-to-end communication between avionic components.

FIG. 7 is an example schematic diagram of a computing device that may be used in conjunction with a separate aircraft system or computing device 750 for end-to-end communication between avionic components. In one example, a computing device 799 may include a processor 702, a memory device 704 coupled to processor 702, one or more wireless transmitters 706, one or more wireless receivers 708, an output component 710, and an input component 77.

Processor 702 includes any suitable programmable circuit including one or more systems and microcontrollers, microprocessors, reduced instruction set circuits (RISC), application specific integrated circuits (ASIC), programmable logic circuits (PLC), field programmable gate arrays (FPGA), and any other circuit capable of executing the functions described herein. The above example examples are not intended to limit in any way the definition and/or meaning of the term "processor."

Memory device 704 includes a non-transitory computer-readable storage medium, such as, without limitation, random access memory (RAM), flash memory, a hard disk drive, a solid state drive, a diskette, a Flash drive, a compact disc, a digital video disc, and/or any suitable memory. In the exemplary implementation, memory device 704 includes data and/or instructions embodying aspects of the disclosure that are executable by processor 702 (e.g., processor 702 may be programmed by the instructions) to enable processor 702 to perform the functions described herein. Additionally, the memory device 704 may comprise an operation system and applications.

Wireless transmitters 706 are configured to transmit control signals and data signals over a network. In one example, wireless transmitters 706 may transmit in a radio frequency spectrum and operate using an appropriate communication protocol.

Wireless receivers 708 are configured to receive control signals and data signals over network. In one example, wireless receivers 708 may receive signals on a radio frequency spectrum using an appropriate communication pro.

The computing device 799 may also include at least one output component 710 for presenting information to a user 701. Output component 710 may be any component capable of conveying information to user 701. In some implementations, output component 710 includes an output adapter, such as a video adapter and/or an audio adapter or the like. An output adapter is operatively coupled to processor 702 and is configured to be operatively coupled to an output device, such as a display device (e.g., a liquid crystal display (LCD), organic light emitting diode (OLED) display, cathode ray tube (CRT), "electronic ink" display, or the like) or an audio output device (e.g., a speaker, headphones, or the like). In some implementations, at least one such display device and/or audio device is included with output component 710.

The computing device 799 may also include at least one input component 77 for receiving input from user 701. Input component 77 may include, for example, a keyboard, a pointing device, a mouse, a stylus, a touch sensitive panel (e.g., a touch pad or a touch screen), a gyroscope, an accelerometer, a position detector, an audio input device, or the like. A single component, such as a touch screen, may function as both an output device of output component 710 and input component 77. In some implementations, output component 710 and/or input component 77 include an adapter for communicating data and/or instructions between the node and a computer connected thereto.

The computing device 799 may also be connected to an aircraft system or an aircraft computing device 750. Referring to FIG. 7, the aircraft system or computing device 750 may include some or all of the same components depicted in computing device 799. For example, the aircraft system or computing device 750 may include: an input component, an output component, a processor, one or more memories, transmitters, and receivers. As shown in FIG. 7, the aircraft system or computing device 750 includes at least one controller 751 and at least one memory 752. The controller 751 may be configured to control the avionic components of the aircraft based on the received data or input from computing device 799. The aircraft system's memory 752 may be configured as a Read-Only memory (ROM). The aircraft system's memory 752 may receive or be loaded with binary data from computing device 799 and further store this data in a separate storage device or component located inside the aircraft.

It will be appreciated that, while various items are illustrated as being stored in memory or on storage while being used, these items or portions of them may be transferred between memory and other storage devices. Alternatively, in other embodiments some or all of the software modules and/or systems may execute in memory on another device and communicate with the illustrated computing systems via inter-computer communication. In some embodiments, some or all of the systems and/or modules may be implemented or provided in other ways, such as at least partially in firmware and/or hardware, including, but not limited to, one or more application-specific integrated circuits (ASICs), standard integrated circuits, controllers (e.g., by executing appropriate instructions, and including microcontrollers and/or embedded controllers), field-programmable gate arrays (FPGAs), complex programmable logic devices (CPLDs), etc. Some or all of the modules, systems and data structures may also be stored (e.g., as software instructions or structured data) on a computer-readable medium, such as a hard disk, a memory, a network or a portable media article to be read by an appropriate drive or via an appropriate connection. The systems, modules and data structures may also be transmitted as generated data signals (e.g., as part of a carrier wave or other analog or digital propagated signal) on a variety of computer-readable transmission media, including wireless-based and wired/cable-based media, and may take a variety of forms (e.g., as part of a single or multiplexed analog signal, or as multiple discrete digital packets or frames). Such computer program products may also take other forms in other embodiments. Accordingly, the present invention may be practiced with other computer system configurations.

In some embodiments, a system memory may be used, which is one embodiment of a computer-readable storage medium, configured to store program instructions and data as described above for FIGS. 1-7 for implementing embodiments of the corresponding methods and apparatus. However, in other embodiments, program instructions and/or data may be received, sent, or stored upon different types of computer-accessible media. Generally speaking, a computer-readable storage medium may include non-transitory and tangible storage media or memory media such as magnetic or optical media, e.g., disk or DVD/CD coupled to a computer system or gateway device. A computer-readable storage medium may also include any volatile or non-volatile media such as RAM (e.g., SDRAM, DDR SDRAM, RDRAM, SRAM, etc.), ROM, etc., that may be included in some embodiments of the computer systems described above as system memory, gateway device, or another type of memory. Portions or all of the multiple computer systems, such as those illustrated herein, may be used to implement the described functionality in various embodiments; for example, software components running on a variety of different devices and servers may collaborate to provide the functionality.

It will be appreciated that in some embodiments the functionality provided by the routines discussed above may be provided in alternative ways, such as being split among more routines or consolidated into fewer routines. Similarly, in some embodiments, illustrated routines may provide more or less functionality than is described, such as when other illustrated routines instead lack or include such functionality respectively or when the amount of functionality that is provided is altered. In addition, while various operations may be illustrated as being performed in a particular manner (e.g., in serial or in parallel) and/or in a particular order, in other embodiments the operations may be performed in other orders and in other manners. Similarly, the data structures discussed above may be structured in different ways in other embodiments, such as by having a single data structure split into multiple data structures or by having multiple data structures consolidated into a single data structure, and may store more or less information than is described (e.g., when other illustrated data structures instead lack or include such information respectively or when the amount or types of information that is stored is altered).

Conditional language used herein, such as, among others, "can," "could," "might," "may," "e.g.," and the like, unless specifically stated otherwise, or otherwise understood within the context as used, is generally intended to convey that certain examples include, while other examples do not include, certain features, elements, and/or steps. Thus, such conditional language is not generally intended to imply that features, elements and/or steps are in any way required for one or more examples or that one or more examples necessarily include logic for deciding, with or without author input or prompting, whether these features, elements and/or steps are included or are to be performed in any particular example. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. As used in the description of the disclosure and the appended claims, the singular forms "a", "an" and "the" are intended to include the plural forms as well, unless the context clearly indicates otherwise. It will be further understood that the terms "comprises" or "comprising," when used in this specification, specify the presence of stated features, integers, steps, operations, elements, and/or components, but do not preclude the presence or addition of one or more other features, integers, steps, operations, elements, components, and/or groups thereof. Furthermore, the terms "data paths" and "route paths," when used in this specification, may be used interchangeably.

In general, the various features and processes described above may be used independently of one another, or may be combined in different ways. All possible combinations and subcombinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example examples. The example systems and components described herein may be configured differently than described. For example, elements may be added to, removed from, or rearranged compared to the disclosed example examples.

It will be understood by those skilled in the art that various changes may be made and equivalents may be substituted for elements thereof without departing from the scope of the teachings herein. In addition, many modifications may be made to adapt the teachings herein to a particular situation without departing from the scope thereof. Therefore, it is intended that the claims not be limited to the particular implementations disclosed herein.

What is claimed:

1. A system (700) for representing end-to-end communication between avionic components of an aircraft communications network, the system comprising:
   a processor (702); and
   one or more memories (704, 752) communicatively coupled to the processor, the one or more memories comprising computer-readable instructions that, when executed by the processor, cause the system to:
      generate (503) a graphical user interface (400) operable to depict an interactive environment representing the avionic components and data paths between the avionic components, the graphical user interface depicting (504) a representation of an input, output, and operation associated with the avionic components including:
         identifying (501) at least one or more avionic components; and
         extracting (502) a component specification associated with the identified avionic components, wherein the extracted component specification comprises information usable to generate (503) the graphical user interface operable (400) to depict an interactive environment representing the avionic components and data paths between the avionic components:
      receive (601), via the graphical user interface, data indicative of the input, output, and operation;
      store (602) the data in a machine readable form; and
      translate (603) the data into binary form usable to control on-aircraft communication between the avionic components.

2. The system of claim 1, wherein the one or more memories further comprises computer-readable instructions that, when executed by the processor, cause the system to:
   visually present (505) the generated graphical user interface to a user (701).

3. The system of claim 1, wherein the graphical user interface depicting an interactive environment is represented by any one of: SysML and XML formats.

4. The system of claim 1, wherein the graphical user interface is configured to receive user input to adjust or re-route data paths between the avionic components.

5. The system of claim 1, wherein the data in binary form is saved into Read-Only-Memory (752) and further stored in an aircraft system (750).

6. The system of claim 1, wherein the system further comprises:
   at least one controller (751) configured to control, based on the received data, communication between the avionic components.

7. A method (500) for representing end-to-end communication between avionic components, the method comprising:
   generating (503) a graphical user interface (400) operable to depict an interactive environment representing the avionic components and data paths between the avionic components, the graphical user interface depicting (504) a representation of an input, output, and operation associated with the avionic components, comprising:
      identifying (501) at least one or more avionic components; and
      extracting (502) a component specification associated with the identified avionic components, wherein the extracted component specification comprises information usable to generate (503) the graphical user interface operable to depict an interactive environment representing the avionic components and data paths between the avionic components;
   receiving (601), via the graphical user interface, data indicative of the input, output, and operation;
   storing (602) the data in a machine readable form; and
   translating (603) the data into binary form usable to control on-aircraft communication between the avionic components.

8. The method of claim 7, further comprising:
   visually presenting (505) the generated graphical user interface to a user.

9. The method of claim 7, wherein the graphical user interface depicting an interactive environment is represented by any one of: SysML and XML formats.

10. The method of claim 7, wherein the graphical user interface is configured to receive user input to adjust or re-route data paths between the avionic components.

11. The method of claim 7, wherein the data in binary form is stored in Read-Only-Memory (752) and further stored in an aircraft system (750).

12. The method of claim 7, further comprising using at least one controller (751) to control, based on the received data, communication between the avionic components.

13. A non-transitory computer-readable medium representing end-to-end communication between avionic components, bearing computer-executable instructions that, when executed upon a computer, cause the computer to perform operations comprising:
   generating (503) a graphical user interface (400) operable to depict an interactive environment representing the avionic components and data paths between the avionic components, the graphical user interface depicting (504) a representation of an input, output, and operation associated with the avionic components, comprising:
      identifying (501) at least one or more avionic components; and
      extracting (502) a component specification associated with the identified avionic components, wherein the extracted component specification comprises information used to generate (503) the graphical user interface operable to depict an interactive environment representing avionic components and data paths between the avionic components;

receiving (601), via the graphical user interface, data indicative of the input, output, and operation;

storing (602) the data in a machine readable form; and translating (603) the data into binary form usable to control on-aircraft communication between the avionic components.

14. The non-transitory computer-readable medium of claim 13, wherein the graphical user interface depicting an interactive environment is represented by any one of: SysML and XML formats.

15. The non-transitory computer-readable medium of claim 13, wherein the graphical user interface is configured to receive user input to adjust or re-route data paths between the avionic components.

16. The non-transitory computer-readable medium of claim 13, wherein the data in binary form is included in a Read-Only-Memory (752) and further stored in an aircraft system (750).

17. The non-transitory computer-readable medium of claim 13, further bearing computer-executable instructions that, when executed upon a computer, cause the computer to perform operations comprising:

control (751), based on the received data, communication between the avionic components.

18. A system (700) for representing end-to-end communication between avionic components of an aircraft communications network, the system comprising:

a processor (702); and one or more memories (704, 752) communicatively coupled to the processor, the one or more memories comprising computer-readable instructions that, when executed by the processor, cause the system to:

generate (503) a graphical user interface (400) operable to depict an interactive environment representing the avionic components and data paths between the avionic components, the graphical user interface depicting (504) a representation of an input, output, and operation associated with the avionic components;

receive (601), via the graphical user interface, data indicative of the input, output, and operation;

store (602) the data in a machine readable form; and translate (603) the data into binary form usable to control on-aircraft communication between the avionic components;

wherein the avionic components depicted in the graphical user interface include hardware components and software components.

19. The system of claim 18, wherein the one or more memories further comprises computer-readable instructions that, when executed by the processor, cause the system to:

visually present (505) the generated graphical user interface to a user (701).

20. The system of claim 18, wherein the graphical user interface depicting an interactive environment is represented by any one of: SysML and XML formats.

21. The system of claim 18, wherein the computer-readable instructions, that when executed by the processor, cause the system to generate (503) the graphical user interface (400) operable to depict the interactive environment representing the avionic components and data paths between the avionic components, the graphical user interface depicting (504) the representation of the input, output, and operation associated with the avionic components comprise further computer-readable instructions, that when executed by the processor, causes the system to:

identify (501) at least one or more avionic components; and extract (502) a component specification associated with the identified avionic components, wherein the extracted component specification comprises information usable to generate (503) the graphical user interface operable (400) to depict an interactive environment representing the avionic components and data paths between the avionic components.

22. The system of claim 18, wherein the graphical user interface is configured to receive user input to adjust or re-route data paths between the avionic components.

23. The system of claim 18, wherein the data in binary form is saved into Read-Only-Memory (752) and further stored in an aircraft system (750).

24. The system of claim 18, wherein the system further comprises:

at least one controller (751) configured to control, based on the received data, communication between the avionic components.

25. A method (500) for representing end-to-end communication between avionic components, the method comprising:

generating (503) a graphical user interface (400) operable to depict an interactive environment representing the avionic components and data paths between the avionic components, the graphical user interface depicting (504) a representation of an input, output, and operation associated with the avionic components;

receiving (601), via the graphical user interface, data indicative of the input, output, and operation;

storing (602) the data in a machine readable form; and translating (603) the data into binary form usable to control on-aircraft communication between the avionic components;

wherein the avionic components depicted in the graphical user interface include hardware components and software components.

26. The method of claim 25, further comprising:

visually presenting (505) the generated graphical user interface to a user.

27. The method of claim 25, wherein the graphical user interface depicting an interactive environment is represented by any one of: SysML and XML formats.

28. The method of claim 25, wherein the generating (503) a graphical user interface (400) operable to depict the interactive environment representing the avionic components and data paths between the avionic components, the graphical user interface depicting (504) the representation of the input, output, and operation associated with the avionic components comprises:

identifying (501) at least one or more avionic components; and extracting (502) a component specification associated with the identified avionic components, wherein the extracted component specification comprises information usable to generate (503) the graphical user interface operable to depict an interactive environment representing the avionic components and data paths between the avionic components.

29. The method of claim 25, wherein the graphical user interface is configured to receive user input to adjust or re-route data paths between the avionic components.

30. The method of claim 25, wherein the data in binary form is stored in Read-Only-Memory (752) and further stored in an aircraft system (750).

31. The method of claim 25, further comprising using at least one controller (751) to control, based on the received data, communication between the avionic components.

32. A non-transitory computer-readable medium representing end-to-end communication between avionic components, bearing computer-executable instructions that, when executed upon a computer, cause the computer to perform operations comprising:
- generating (503) a graphical user interface (400) operable to depict an interactive environment representing the avionic components and data paths between the avionic components, the graphical user interface depicting (504) a representation of an input, output, and operation associated with the avionic components;
- receiving (601), via the graphical user interface, data indicative of the input, output, and operation;
- storing (602) the data in a machine readable form; and
- translating (603) the data into binary form usable to control on-aircraft communication between the avionic components;
- wherein the avionic components depicted in the graphical user interface include hardware components and software components.

33. The non-transitory computer-readable medium of claim 32, wherein the graphical user interface depicting an interactive environment is represented by any one of: SysML and XML formats.

34. The non-transitory computer-readable medium of claim 32, wherein the computer-executable instructions that, when executed upon a computer, cause the computer to perform operations comprising generating (503) the graphical user interface (400) operable to depict the interactive environment representing the avionic components and data paths between the avionic components, the graphical user interface depicting (504) the representation of the input, output, and operation associated with the avionic components further comprise computer-executable instructions that, when executed upon the computer, cause the computer to perform operations comprising:
- identifying (501) at least one or more avionic components; and
- extracting (502) a component specification associated with the identified avionic components,
- wherein the extracted component specification comprises information used to generate (503) the graphical user interface operable to depict an interactive environment representing avionic components and data paths between the avionic components.

35. The non-transitory computer-readable medium of claim 32, wherein the graphical user interface is configured to receive user input to adjust or re-route data paths between the avionic components.

36. The non-transitory computer-readable medium of claim 32, wherein the data in binary form is included in a Read-Only-Memory (752) and further stored in an aircraft system (750).

37. The non-transitory computer-readable medium of claim 32, further bearing computer-executable instructions that, when executed upon a computer, cause the computer to perform operations comprising:
- control (751), based on the received data, communication between the avionic components.

* * * * *